(12) United States Patent
Hayashi

(10) Patent No.: US 8,206,605 B2
(45) Date of Patent: Jun. 26, 2012

(54) SUBSTRATE PROCESSING METHOD AND SUBSTRATE PROCESSING SYSTEM

(75) Inventor: Daisuke Hayashi, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 976 days.

(21) Appl. No.: 11/869,151

(22) Filed: Oct. 9, 2007

(65) Prior Publication Data
US 2008/0099440 A1    May 1, 2008

Related U.S. Application Data

(60) Provisional application No. 60/883,240, filed on Jan. 3, 2007.

(30) Foreign Application Priority Data

Nov. 1, 2006 (JP) .................... 2006-298187

(51) Int. Cl.
*C03C 15/00* (2006.01)
(52) U.S. Cl. ............ 216/72; 216/47; 216/49; 216/58; 216/67; 216/79
(58) Field of Classification Search ............ 216/47, 216/49, 58, 67, 72, 79
See application file for complete search history.

(56) References Cited

U.S. PATENT DOCUMENTS

| | | | | |
|---|---|---|---|---|
| 5,376,233 A | * | 12/1994 | Man | 438/738 |
| 5,439,553 A | * | 8/1995 | Grant et al. | 216/58 |
| 5,658,417 A | | 8/1997 | Watanabe et al. | |
| 5,990,019 A | * | 11/1999 | Torek et al. | 438/723 |
| 5,994,238 A | * | 11/1999 | Park | 438/738 |
| 6,190,955 B1 | | 2/2001 | Ilg et al. | |
| 2006/0191865 A1 | | 8/2006 | Nishimura et al. | |
| 2008/0003365 A1 | * | 1/2008 | Nishimura | 427/307 |
| 2008/0045030 A1 | * | 2/2008 | Tahara | 438/715 |
| 2008/0078743 A1 | * | 4/2008 | Munoz et al. | 216/58 |

FOREIGN PATENT DOCUMENTS

| | | |
|---|---|---|
| JP | 3-147322 | 6/1991 |
| JP | 03-204930 | 9/1991 |
| JP | 5-217997 | 8/1993 |
| JP | 2000-340551 | 12/2000 |
| JP | 2001-351899 | 12/2001 |
| JP | 2002-33313 | 1/2002 |
| JP | 2002-217414 | 8/2002 |
| JP | 2005-150597 | 6/2005 |
| JP | 2006-261633 | 9/2006 |

OTHER PUBLICATIONS

Office Action issued Feb. 17, 2011 in Japan Application No. 2006-298187 (With Partial English Translation).
Office Action issued Jun. 28, 2011 in Japanese Patent Application No. 2006-298187, filed Nov. 1, 2006 (with partial English-language translation).

* cited by examiner

*Primary Examiner* — Nadine G Norton
*Assistant Examiner* — Christopher Remavege
(74) *Attorney, Agent, or Firm* — Oblon, Spivak, McClelland, Maier & Neustadt, L.L.P.

(57) ABSTRACT

A substrate processing method capable of preventing a reduction in productivity of the fabrication of a semiconductor device from a substrate. An HF gas is supplied toward a wafer having a thermally-oxidized film, a BPSG film, and a deposit film, to thereby selectively etch the BPSG film and the deposit film using fluorinated acid. A residual matter of $H_2SiF_6$ produced at the time of etching is decomposed into HF and $SiF_4$ by being heated.

2 Claims, 7 Drawing Sheets

SUBSTRATE PROCESSING METHOD AND SUBSTRATE PROCESSING SYSTEM

BACKGROUND OF THE INVENTION

1. Field of the Invention

The present invention relates to a substrate processing method and a substrate processing system, and more particularly, to a substrate processing method for removing a hard mask and a deposit film from a substrate, and a substrate processing system for implementing the substrate processing method.

2. Description of the Related Art

A semiconductor wafer W as shown in FIG. 7 has been known, which has a single-crystal silicon substrate base 71 on which a thermally-oxidized film 72 made of $SiO_2$, films 73, 74, and an oxide film such as a BPSG (boron phosphorous silicate glass) film 75 are formed in layers. To form a hole or a trench (groove) in the single-crystal silicon substrate base 71 of the wafer W, the silicon substrate base 71 is dry-etched in a depressurized environment using a plasma generated from a halogen-based processing gas such as an HBr (hydrogen bromide) gas and using the BPSG film 75 as a hard mask. At that time, the plasma reacts with silicon (Si) and as a result, a deposit film 76 of SiOBr is formed on a surface of the hole or the like. The deposit film 76 functions to suppress the single-crystal silicon substrate base 71 from being dry-etched.

The BPSG film 75 and the deposit film 76 of the wafer W can cause a conduction failure of a semiconductor device fabricated from the wafer W, and therefore these films must be removed. To remove the hard mask such as the BPSG film 75, a wet etching is employed (see for example, Japanese Laid-open Patent Publication No. 2005-150597).

Since a wet etching uses a chemical solution, a wet etching apparatus cannot be installed on the same substrate processing system together with a dry etching apparatus for dry-etching wafers W in a depressurized environment. In other words, the wet etching apparatus must be installed at a location different from the dry etching apparatus. Furthermore, the wafer W having been formed with a hole or the like in its single-crystal silicon substrate base 71 using the dry etching apparatus must be transferred out from the dry etching apparatus and then transferred in the ambient air before it is transferred into the wet etching apparatus. As a result, the substrate processing process is made complicated.

Moreover, the deposit film 76 made of SiOBr of the wafer W can react with the moisture content of the ambient air during the transfer of the wafer W in ambient air. Thus, it is necessary to manage a time period (Q-Time) during which the wafer W is exposed. More specifically, the exposure time period must be shortened to a minimum. The management of the exposure time period requires considerable man-hours.

In other words, the removal of the BPSG film 75 and the deposit film 76 causes a reduction in productivity of the fabrication of semiconductor devices from wafers W.

SUMMARY OF THE INVENTION

The present invention provides a substrate processing method and a substrate processing system capable of preventing a reduction in productivity of the fabrication of a semiconductor device from a substrate.

According to a first aspect of the present invention, there is provided a substrate processing method for processing a substrate having a single-crystal silicon substrate base, a first oxide film formed by a thermal oxidation treatment, and a second oxide film containing an impurity, a part of the single-crystal silicon substrate base being exposed through the first and second oxide films, comprising a plasma etching step of etching the exposed single-crystal silicon substrate base using a plasma of a halogen-based gas, an HF gas supply step of supplying an HF gas toward the substrate, and a substrate heating step of heating the substrate to which the HF gas is supplied.

With the substrate processing method according to the present invention, the single-crystal silicon substrate base partly exposed through the first oxide film formed by a thermal oxidation treatment and the second oxide film containing an impurity is etched by the plasma of the halogen-based gas, the HF gas is supplied to the substrate, and the substrate is heated. When the single-crystal silicon substrate base is etched by the plasma of the halogen-based gas, a deposit film is formed. From the HF gas, fluorinated acid is generated that selectively etches the deposit film and the second oxide film and produces a residual matter that can be decomposed by being heated. Thus, the deposit film and the second oxide film can be removed in a dry environment, and therefore, an apparatus for etching the single-crystal silicon substrate base and an apparatus for removing the deposit film and the second oxide film can be installed together on the same substrate processing system. As a result, the deposit film and the second oxide film of the substrate whose single-crystal silicon substrate base has been etched can be removed, without the substrate being exposed to the ambient air, whereby the substrate processing processes can be simplified and the necessity of managing a time period of exposure of the substrate to the ambient air can be eliminated, making it possible to prevent a reduction in productivity of the fabrication of a semiconductor device from the substrate.

In the present invention, it is possible to make the substrate so as not to be exposed to the ambient air during the plasma etching step, the HF gas supply step, and the substrate heating step.

In that case, the substrate is not exposed to the ambient air while the substrate is being etched by the plasma of the halogen-based gas, and the HF gas is supplied toward the substrate which is then heated. This ensures that it is unnecessary to manage the time period of exposure of the substrate to the ambient air.

The substrate can be heated in an $N_2$ gas ambient in the substrate heating step.

In that case, the substrate is heated in the $N_2$ gas ambient. The $N_2$ gas forms a stream of gas that catches and transfers the residual matter decomposed by being heated. Thus, the deposit film and the second oxide film can reliably be removed.

According to a second aspect of the present invention, there is provided a substrate processing method for processing a substrate having a single-crystal silicon substrate base, a first oxide film formed by a thermal oxidation treatment, and a second oxide film containing an impurity, a part of the single-crystal silicon substrate base being exposed through the first and second oxide films, comprising a plasma etching step of etching the exposed single-crystal silicon substrate base using a plasma of a halogen-based gas, an HF gas supply step of supplying an HF gas toward the substrate, and a cleaning gas supply step of supplying a cleaning gas containing at least $NH_3$ gas toward the substrate to which the HF gas is supplied.

With this substrate processing method, the single-crystal silicon substrate base of the substrate partly exposed through the first oxide film formed by the a thermal oxidation treatment and the second oxide film including impurity is etched by the plasma of the halogen-based gas, the HF gas is supplied to the substrate, and the cleaning gas containing at least $NH_3$ is further supplied to the substrate. When the single-crystal silicon substrate base is etched by the plasma of the halogen-based gas, a deposit film is formed. Fluorinated acid produced from the HF gas selectively etches the deposit film and the second oxide film, and produces a residual matter. The $NH_3$ gas reacts with the residual matter to produce a product of reaction that can easily be sublimated. Since the reaction product is easily sublimated, it is possible to remove the deposit film and the second oxide film in a dry environment, and therefore, an apparatus for etching the single-crystal silicon substrate base and an apparatus for removing the deposit film and the second oxide film can be installed together on the same substrate processing system. After the single-crystal silicon substrate base of the substrate is etched, the deposit film and the second oxide film can be removed without exposing the substrate to the ambient air. Thus, the substrate processing process can be simplified and the need of managing a time period of exposure of the substrate to the ambient air can be eliminated, making it possible to prevent a reduction in the productivity of the fabrication of a semiconductor device from the substrate.

The substrate processing method can permit the substrate not to be exposed to the ambient air during the plasma etching step, the HF gas supply step, and the cleaning gas supply step.

In that case, while the substrate is being etched by the plasma of the halogen-based gas and the HF gas and the cleaning gas are being supplied toward the substrate, the substrate is not exposed to the ambient air, making it unnecessary to manage the time period of exposure of the substrate to the ambient air.

According to a third embodiment of the present invention, there is provided a substrate processing system for processing a substrate having a single-crystal silicon substrate base, a first oxide film formed by a thermal oxidation treatment, and a second oxide film containing an impurity, a part of the single-crystal silicon substrate base being exposed through the first and second oxide films, comprising a plasma etching apparatus adapted to etch the exposed single-crystal silicon substrate base using a plasma of a halogen-based gas, an HF gas supply apparatus adapted to supply an HF gas toward the substrate, and a substrate heating apparatus adapted to heat the substrate to which the HF gas is supplied.

The substrate processing system according to the third aspect realizes advantages similar to those attained by the substrate processing method according to the first aspect of this invention.

The substrate processing system can include a substrate transferring apparatus disposed between the plasma etching apparatus, the HF gas supply apparatus, and the substrate heating apparatus, the substrate transferring apparatus being adapted to transfer the substrate such that the substrate is not exposed to ambient air.

In that case, the substrate is not exposed to ambient air during the time it is etched by the plasma of the halogen-based gas, and the HF gas is supplied toward the substrate which is then heated. Therefore, it is unnecessary to manage the time period of exposure of the substrate to the ambient air.

In the substrate processing system, the HF gas supply apparatus and the substrate heating apparatus can each be constructed by the same apparatus.

With this substrate processing system, the HF gas supply apparatus and the substrate heating apparatus are each constructed by the same apparatus, and therefore, the substrate processing system can be downsized.

According to a fourth aspect of this invention, there is provided a substrate processing system for processing a substrate having a single-crystal silicon substrate base, a first oxide film formed by a thermal oxidation treatment, and a second oxide film containing an impurity, a part of the single-crystal silicon substrate base being exposed through the first and second oxide films, comprising a plasma etching apparatus adapted to etch the exposed single-crystal silicon substrate base using a plasma of a halogen-based gas, an HF gas supply apparatus adapted to supply an HF gas toward the substrate, and a cleaning gas supply apparatus adapted to supply a cleaning gas containing at least $NH_3$ gas toward the substrate to which the HF gas is supplied.

The substrate processing system according to the fourth embodiment can produce advantages similar to those attained by the substrate processing method according to the second embodiment of this invention.

The substrate processing system can include a substrate transferring apparatus disposed between the plasma etching apparatus, the HF gas supply apparatus, and the substrate heating apparatus, the substrate transferring apparatus being adapted to transfer the substrate such that the substrate is not exposed to ambient air.

In that case, while the substrate is being etched by the plasma of the halogen-based gas and the HF gas and the cleaning gas are being supplied toward the substrate, the substrate is not exposed to the ambient air, making it unnecessary to manage the time period of exposure of the substrate to the ambient air.

Further features of the present invention will become apparent from the following description of exemplary embodiments with reference to the attached drawings.

BRIEF DESCRIPTION OF THE DRAWINGS

FIGS. 3A to 3D are a process diagram showing the substrate processing method implemented by the substrate processing system shown in FIG. 1, wherein FIG. 3A shows a plasma etching step, FIG. 3B shows an HF gas supply step, FIG. 3C shows deposition of a residual matter onto a silicon substrate base, and FIG. 3D shows removal of the residual matter;

FIGS. 6A to 6E are a process diagram showing the substrate processing method implemented by the substrate processing system of the second embodiment, wherein FIG. 6A shows a plasma etching step, FIG. 6B shows an HF gas supply step, FIG. 6C shows deposition of a residual matter onto a silicon substrate base, FIG. 6D shows a cleaning gas supply step, and FIG. 6E shows removal of the residual matter.

DETAILED DESCRIPTION OF THE PREFERRED EMBODIMENTS

The present invention will now be described in detail below with reference to the drawings showing preferred embodiments thereof.

First, an explanation will be given of a substrate processing system according to a first embodiment of the present invention.

Figure 1:
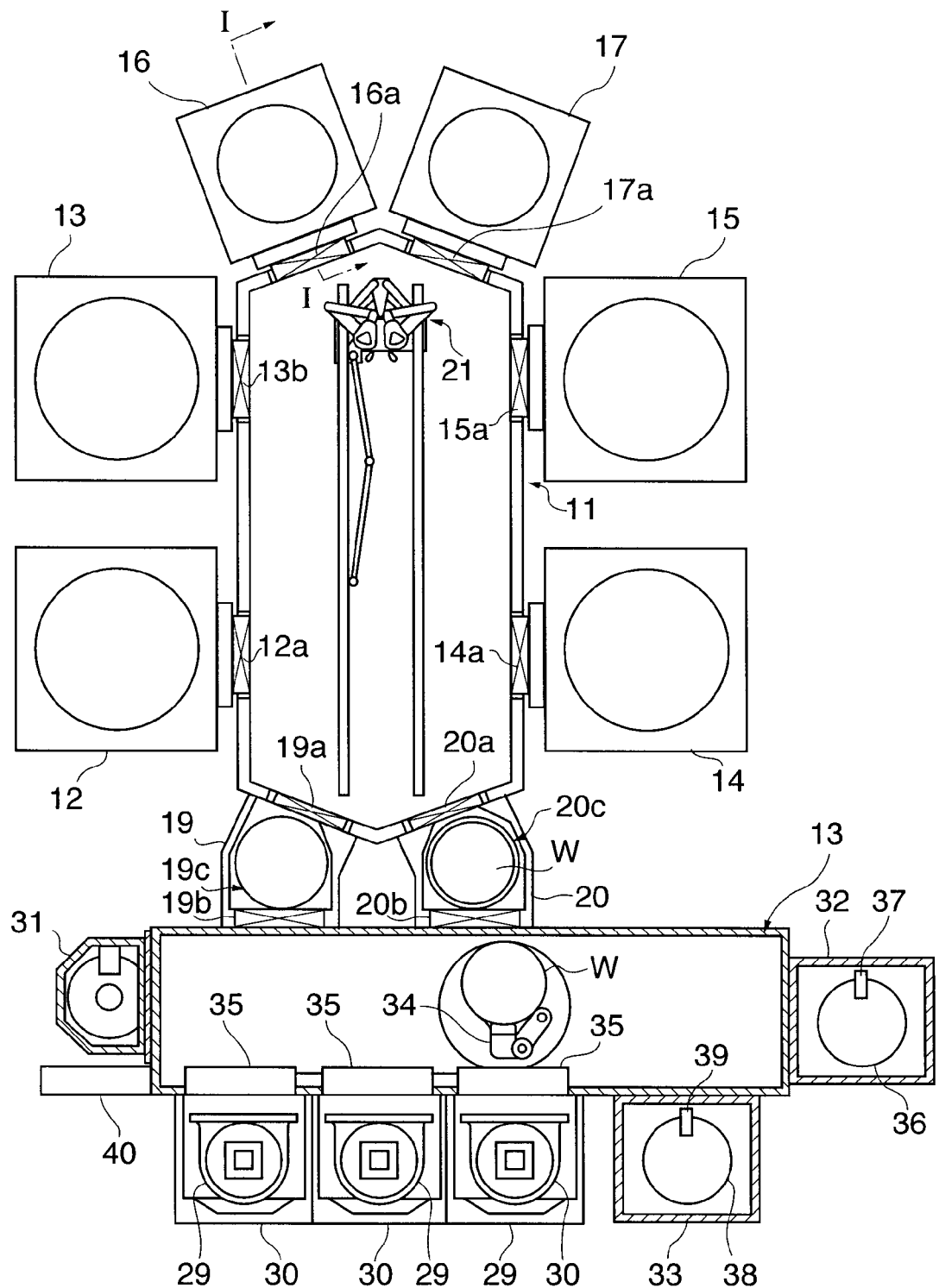
FIG. 1 is a plan view schematically showing the construction of the substrate processing system of this embodiment.

FIG. 1 is a plan view schematically showing the construction of the substrate processing system of this embodiment.

As shown in FIG. 1, the substrate processing apparatus 10 is comprised of a transfer module 11 (substrate transferring apparatus) having a hexagonal shape as viewed in plan, two plasma process modules 12, 13 (plasma etching apparatuses) connected to one side surface of the transfer module 11, two plasma process modules 14, 15 (plasma etching apparatuses) connected to another side surface of the transfer module 11 such as to face the plasma process modules 12, 13, a gas process module 16 (HF gas supply apparatus) disposed adjacent to the plasma process module 13 and connected to the transfer module 11, a heating process module 17 (substrate heating apparatus) disposed adjacent to the plasma process module 15 and connected to the transfer module 11, a loader module 18 which is a rectangular transfer chamber, and two load lock modules 19, 20 disposed between the transfer module 11 and the loader module 18 for connecting them.

The transfer module 11 has disposed therein a transfer arm 21 that can bend/elongate and turn. The transfer arm 21 can transfer wafers W between the plasma process modules 12 to 15, the gas process module 16, the heating process module 17, and the load lock modules 19, 20.

Figure 7:
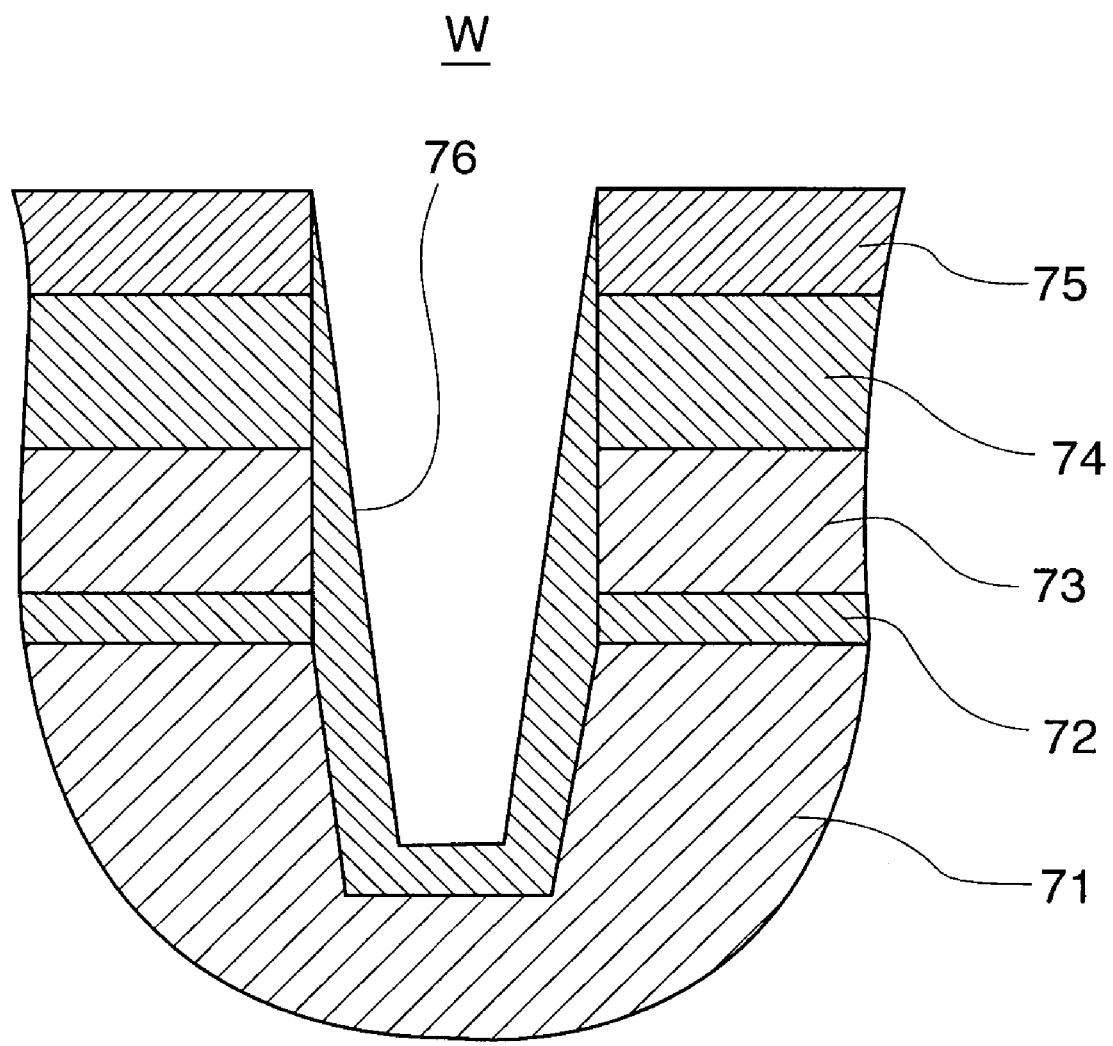
FIG. 7 is a section view schematically showing the construction of a substrate having a hole surface on which a deposit film of SiOBr is formed.

The plasma process module 12 to 15 each include a processing chamber for receiving a wafer W. Each plasma process module can introduce a halogen-based processing gas, for example an HBr gas, into the chamber and generate electric field in the chamber, thereby generating a plasma from the introduced processing gas. Using the plasma, the plasma process module can etch the wafer W. More specifically, a single-crystal silicon substrate base 71 of the wafer W shown in FIG. 7 is etched.

Figure 2A:
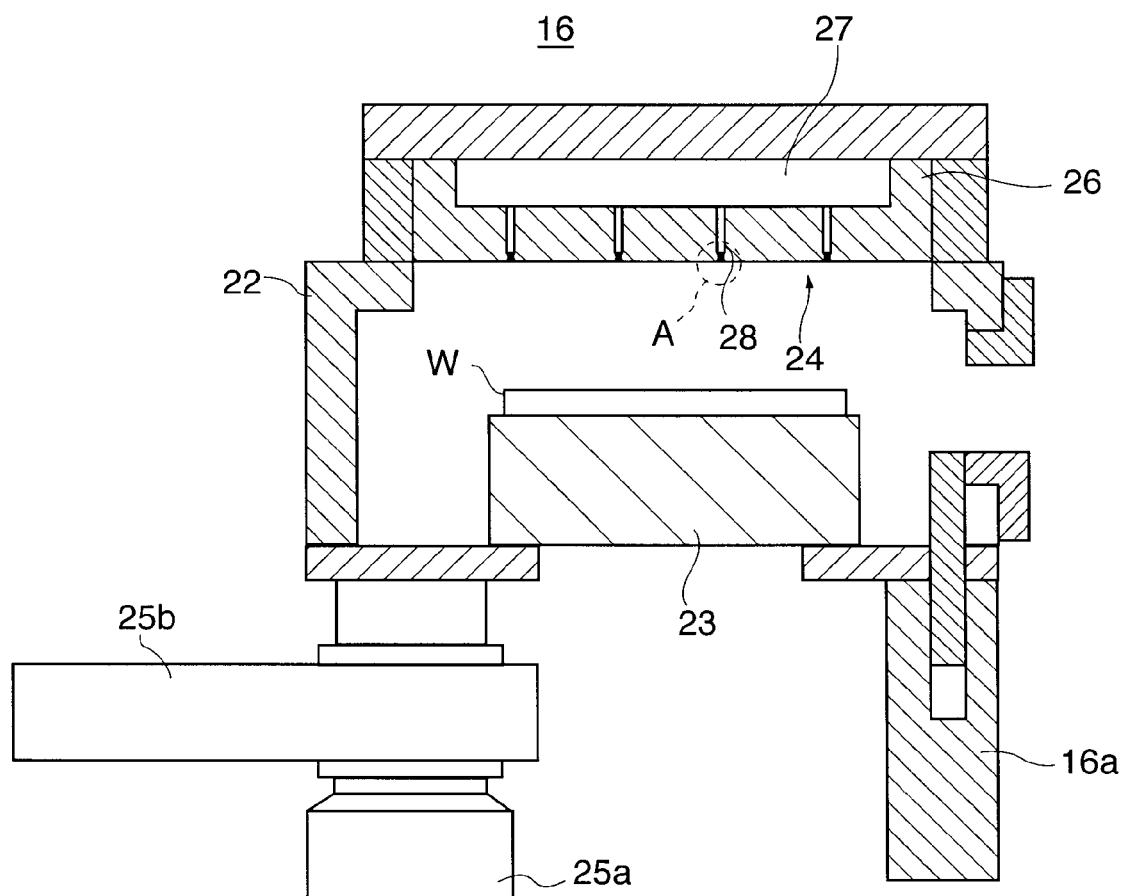
FIG. 2A is a section view showing the gas process module in FIG. 1 taken along line I-I in FIG. 1.
Figure 2B:
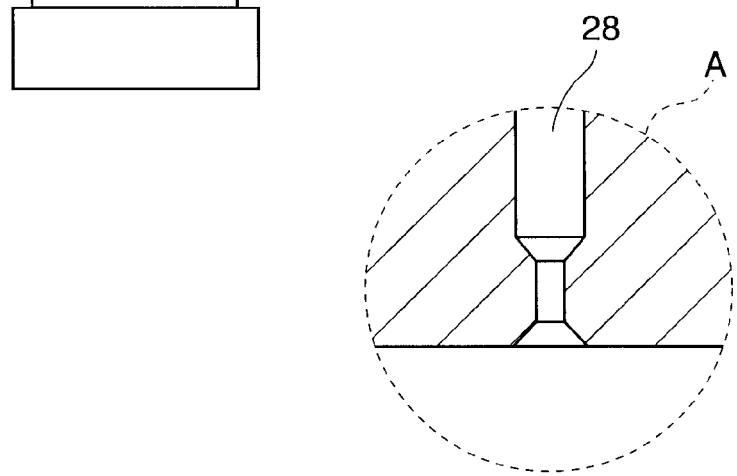
FIG. 2B is an enlarged view showing an A portion in FIG. 2A.

FIG. 2A is a section view showing the gas process module 16 in FIG. 1 taken along line I-I in FIG. 1, and FIG. 2B is an enlarged view showing an A portion in FIG. 2A.

As shown in FIG. 2A, the gas process module 16 includes a processing chamber 22, a wafer-mounting stage 23 disposed within the chamber 22, a shower head 24 disposed in an upper part of the chamber 22 such as to face the stage 23, a TMP (turbo molecular pump) 25a for exhausting a gas and the like out from the chamber 22, and an APC (adaptive pressure control) valve 25b, which is a variable butterfly valve, disposed between the chamber 22 and the TMP 25a.

The shower head 24 is comprised of a disk-shaped gas supply unit 26 having a buffer chamber 27 formed therein. The buffer chamber 27 is communicated via gas-passing holes 28 with the inside of the chamber 22, and is connected to an HF gas supply system (not shown) that can supply an HF gas to the buffer chamber 27. The supplied HF gas is then supplied via the gas-passing holes 28 to the inside of the chamber 22.

As shown in FIG. 2B, the gas-passing holes 28 formed in the shower head 24 each have a portion thereof opening into the chamber 22 and formed such as to widen out toward an end of the gas-passing hole. As a result, the HF gas can efficiently be diffused into the chamber 22. Furthermore, the gas-passing holes 28 each have a constriction in its cross section, and therefore, any residual matter or the like produced in the chamber 22 can be prevented from flowing back into the gas-passing holes 28 and then into the buffer chamber 27.

In the gas process module 16, a heater (not shown), for example a heating element, is built in a side wall of the chamber 22. By heating the side wall of the chamber 22 by the heating element, a residual matter produced when the BPSG film 75 and the deposit film 76 are removed using fluorinated acid can be prevented from being attached to the side wall of the chamber.

Moreover, the stage 23 has a coolant chamber (not shown) as a temperature adjusting mechanism, in which a coolant, for example cooling water or a Galden (registered trademark) fluid, at a predetermined temperature is circulated. The temperature of the wafer W attracted to and held on an upper surface of the stage 23 is controlled through the temperature of the coolant.

Referring to FIG. 1 again, the heating process module 17 includes a processing chamber for receiving a wafer W. The chamber is provided with a halogen lamp, a sheet heater, or the like, and can heat the wafer W received therein.

The insides of the transfer module 11, the plasma process modules 12 to 15, the gas process module 16, and the heating process module 17 can be depressurized. The transfer module 11 is connected via vacuum gate valves 12a to 17a to the plasma process modules 12 to 15, the gas process module 16, and the heating process module 17.

In the substrate processing system 10, the internal pressure in the transfer module 11 is held at vacuum, whereas that in the loader module 18 is held at atmospheric pressure. To this end, the load lock modules 19, 20 are provided with vacuum gate valves 19a, 20a at connecting parts between themselves and the transfer module 11, and provided with atmospheric gate valves 19b, 20b at connecting parts between themselves and the loader module 18, whereby each load lock module is constructed as a preliminary vacuum transfer chamber whose internal pressure can be adjusted. The load lock modules 19, 20 are further provided with wafer-mounting stages 19c, 20c on each of which a wafer W delivered between the loader module 18 and the transfer module 11 can temporarily be placed.

In addition to the load lock modules 19, 20, there are connected to the loader module 18 three FOUP-mounting stages 30 each mounted with a FOUP (front opening unified pod) 29, which is a container adapted to house twenty-five wafers W, an orienter 31 used for pre-alignment of a wafer W transferred out from a FOUP 29, and first and second IMS's (integrated metrology systems manufactured by Therma-Wave, Inc.) 32, 33 for measuring the surface state of the wafer W.

The load lock modules 19, 20 are connected to a longitudinal side wall of the loader module 18 and disposed to face the three FOUP mounting stages 30, with the loader module 18 interposed therebetween. The orienter 31 is disposed at a longitudinal one end of the loader module 18, the first IMS 32 is disposed at another longitudinal end of the loader module 18, and the second IMS 33 is disposed alongside the three FOUP mounting stages 30.

The loader module 18 includes a SCARA-type dual arm transfer arm 34 disposed therein for transferring a wafer W, and three loading ports 35 formed in a side wall of the loader module 18 to correspond to the FOUP mounting stages 30. The transfer arm 34 takes a wafer W out from the corresponding FOUP 29 on the FOUP mounting stage 30 through the loading port 35, and transfers the removed wafer W into and out of the load lock modules 19, 20, the orienter 31, the first IMS 32, and the second IMS 33.

The first IMS 32 is an optical monitor that has a mounting stage 36 adapted to be mounted with a wafer W transferred into the first IMS 32, and an optical sensor 37 adapted to be directed to the wafer W mounted on the stage 36. The first IMS 32 measures the surface shape of the wafer W, for example the film thickness of a surface layer thereof, and CD (critical dimension) values of wiring grooves, gate electrodes and so on formed therein. Like the first IMS 32, the second IMS 33 is an optical monitor and has amounting stage 38 and an optical sensor 39. The second IMS measures, for example, a number of particles on a surface of the wafer W.

The substrate processing system 10 is provided with an operation panel 40 disposed at a longitudinal one end of the loader module 18. The operation panel 40 has a display section comprised of, for example, an LCD (liquid crystal display), for displaying the state of operation of component elements of the substrate processing system 10.

To permit an apparatus for removing the BPSG film 75 and the deposit film 76 of a wafer W shown in FIG. 7 to be installed on the substrate processing system 10, the films 75, 76 must be removed in a dry environment. The BPSG film 75 is a silicon-base oxide film, the deposit film 76 is a pseudo-$SiO_2$ film made of SiOBr, and the thermally-oxidized film 72 is an $SiO_2$ film. Therefore, there is a possibility that the thermally-oxidized film 72 can be removed when the BPSG film 75 and the deposit film 76 are removed. If the thermally-oxidized film 72 is removed, that part of the hole or the trench which corresponds to the film 72 can be caved in such that a notch is formed therein. Thus, the BPSG film 75 and the deposit film 76 must be removed at a high selectivity ratio to the thermally-oxidized film 72.

To find a method capable of removing the BPSG film 75 and the deposit film 76 in a manner to satisfy the above described necessary conditions, the present inventors conducted various experiments. As a result, it was found that the BPSG film 75 and the deposit film 76 could be removed and the selectivity ratio of the films 75, 76 to the film 72 could be increased up to 1000 by supplying only an HF gas to the wafer W, without supplying $H_2O$ gas, in an environment where substantially no $H_2O$ is present.

The present inventors further conducted extensive research on the mechanism of the above described removal method, and reached a tentative theory, which will be described below.

When an HF gas is combined with $H_2O$, fluorinated acid is formed which erodes and removes an oxide film. In order to form fluorinated acid from the HF gas in an environment where there is substantially no $H_2O$, the HF gas must be combined with water ($H_2O$) molecules contained in the oxide film.

The BPSG film 75 is formed by vapor deposition such as CVD processing, and the deposit film 76 is formed by reaction between plasma and silicon. Thus, these films 75, 76 are nondense in film structure and hence likely to be attached with water molecules. Thus, the BPSG film 75 and the deposit film 76 contain some water molecules. When the HF gas reaches the films 75, 76, the HF gas is combined with water molecules to form fluorinated acid, which erodes the films 75, 76. Thus, the BPSG film 75 and the deposit film 76 can be removed without using a chemical solution and plasma.

On the other hand, the thermally-oxidized film 72 is formed by a thermal oxidation treatment in an environment where the temperature is in the range from 800 to 900 degrees C. Thus, no water molecules are contained in the thermally-oxidized film 72 during the fabrication of the film. Besides, the thermally-oxidized film 72 is dense in film structure, and therefore, water molecules are less easily to be attached to the film 72. As a result, the thermally-oxidized film 72 contains substantially no water molecules. Since water molecules are not present, even if the supplied HF gas reaches the film 72, the HF gas does not form fluorinated acid and thus the thermally-oxidized film 72 is not eroded.

Accordingly, the selectivity ratio of the BPSG film 75 and the deposit film 76 to the thermally-oxidized film 72 can be increased (for example, up to 1000) and therefore, these films 75, 76 can selectively be etched by supplying only the HF gas to the wafer, without $H_2O$ gas being supplied, in an environment where substantially no $H_2O$ is present.

When the BPSG film 75 and the deposit film 76 are removed using fluorinated acid, chemical reaction takes place between $SiO_2$ in the films 75, 76 and fluorinated acid (HF) as represented by the following chemical formulae.

$$SiO_2 + 4HF \rightarrow SiF_4 + 2H_2O\uparrow$$

$$SiF_4 + 2HF \rightarrow H_2SiF_6$$

In this way, there is produced a residual matter ($H_2SiF_6$). The residual matter can cause conduction failure of resultant semiconductor devices and thus must be removed.

In this embodiment, thermal energy is utilized to remove the residual matter. More specifically, a wafer W in which the residual matter has been produced is heated, thereby thermally decomposing the residual matter as represented by the following formula.

$$H_2SiF_6 + Q(\text{thermal energy}) \rightarrow 2HF\uparrow + SiF_4\uparrow$$

That is, in this embodiment, $H_2SiF_6$ which is the residual matter formed as a result of reaction between $SiO_2$ and fluorinated acid is removed by heating.

Next, a substrate processing method of this embodiment will be described.

FIGS. 3A to 3D are a process diagram showing the substrate processing method implemented by the substrate processing system shown in FIG. 1.

First, a thermally-oxidized film 72, films 73, 74, and a BPSG film 75 are formed in layers on a single-crystal silicon substrate base 71, thereby preparing a wafer W in which part of the single-crystal silicon substrate base 71 is exposed through the films 72 to 75. Then, the wafer W is transferred into either one of the plasma process modules 12 to 15. In the plasma process module into which the wafer W has been transferred, a hole or a trench is formed in the single-crystal silicon substrate base 71 of the wafer W using a plasma generated from an HBr gas (plasma etching step). At that time, a deposit film 76 is formed in the hole or the trench of the wafer W (FIG. 3A).

Figure 3A:
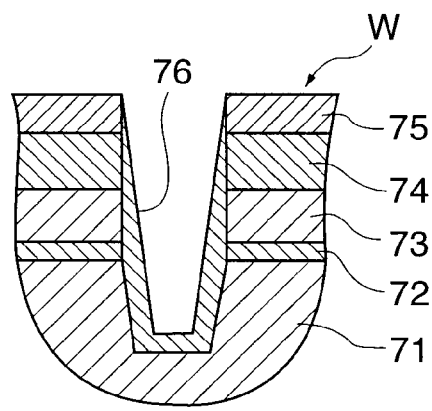
Figure 3B:
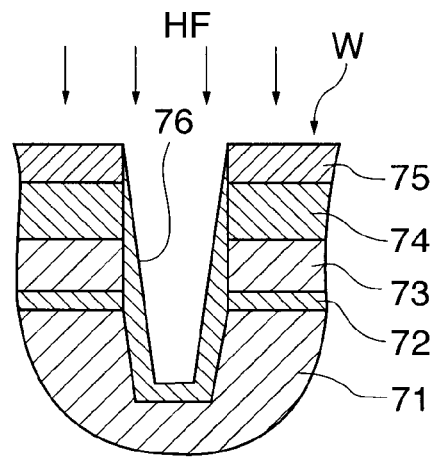

Next, the wafer W shown in FIG. 3A is transferred out from the chamber of the plasma process module, and is transferred via the transfer module 11 into the chamber 22 of the gas process module 16. Then, the wafer W is placed on the stage 23. The pressure in the chamber 22 is set to $1.3 \times 10^1$ to $1.1 \times 10^3$ Pa (1 to 8 Torrs) using the APC valve 25b and the like, and the ambient temperature in the chamber 22 is set in the range from 40 to 60 degrees C. using the heater in the side wall of the chamber. Then, the HF gas is supplied toward the wafer W from the gas supply unit 26 of the shower head 24 at a flow rate ranging from 40 to 60 SCCM (HF gas supply step) (FIG. 3B). At that time, water molecules are nearly completely removed from inside the chamber 22, and $H_2O$ gas is not supplied into the chamber 22.

Figure 3C:
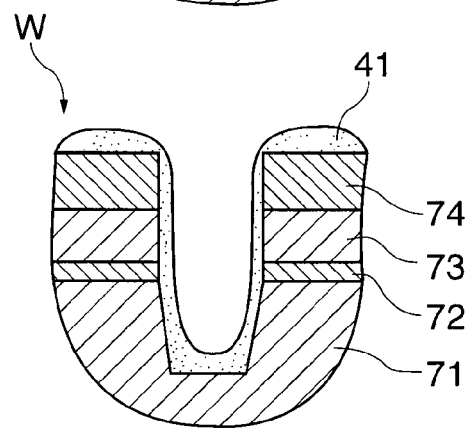

The HF gas reaching the BPSG film 75 and the deposit film 76 is combined with water molecules contained in the film 75, 76 to thereby produce fluorinated acid. The fluorinated acid erodes the BPSG film 75 and the deposit film 76. As a result, the films 75, 76 are selectively etched. On the other hand, a residual matter 41 is produced as a result of chemical reaction between the fluorinated acid and $SiO_2$ in the BPSG film 75 and the deposit film 76. In the hole or the trench, the residual matter 41 is deposited on the films 73, 74, the thermally-oxidized film 72, and the single-crystal silicon substrate base 71 (FIG. 3C).

Figure 3D:
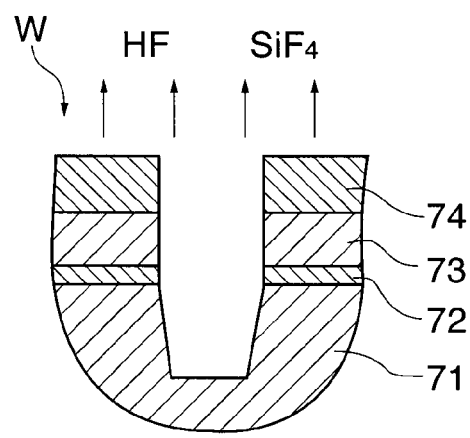

Next, the wafer W on which the residual matter 41 has been deposited is transferred out from the chamber 22 of the gas process module 16, and is then transferred via the transfer module 11 into the chamber of the heating process module 17. The heating process module 17 heats the wafer W transferred thereinto up to a predetermined temperature, specifically, to 150 degrees C. or higher (substrate heating step). The heating process module 17 introduces $N_2$ gas into the chamber thereof. The introduced $N_2$ gas forms a stream of gas in the chamber. At that time, $H_2SiF_6$ forming the residual matter 41 is decomposed by heat into HF and $SiF_4$. The resultant HF and $SiF_4$ are caught and removed by the stream of gas (FIG. 3D).

Next, the wafer W is transferred out from the chamber 22 of the heating process module 17, whereupon the present process is completed.

According to the substrate processing method of this embodiment, the single-crystal silicon substrate base 71 of the wafer W that is partly exposed through the thermally-oxidized film 72, the films 73, 74, and the BPSG film 75 is etched by the plasma of HBr gas, the HF gas is supplied toward the wafer W, and the wafer W is heated. When the single-crystal silicon substrate base 71 is etched by the plasma of HBr gas, a deposit film 76 is formed. Fluorinated acid generated from the HF gas selectively etches the deposit film 76 and the BPSG film 75, and on the other hand, a residual matter 41 ($H_2SiF_6$) is generated. By being heated, the residual matter 41 is decomposed into HF and $SiF_4$. As a result, the deposit film 76 and the BPSG film 75 can be removed in a dry environment. This makes it possible to dispose the gas process module 16 and the heating process module 17 in one substrate processing system 10. Thus, after the single-crystal silicon substrate base 71 of the wafer W has been etched, the wafer W can be transferred via the transfer module 11 into the gas process module 16 or the heating process module 17. Therefore, without the wafer W being exposed to the atmospheric air, the deposit film 76 and the BPSG film 75 of the wafer W can be removed, making it possible to simplify the substrate processing process and eliminate the need of managing a time period during which the wafer W is exposed. As a result, it is possible to prevent a reduction in the productivity of the fabrication of a semiconductor device from the wafer W.

With the above described substrate processing method, the gas process module 16 and the heating process module 17 can be disposed in one substrate processing system 10. Thus, it is unnecessary to dispose the gas process module 16 and the heating process module 17 at different places, making it possible to reduce a system installation area (footprint).

Furthermore, with the above described substrate processing method, the wafer W is heated in $N_2$ gas ambient. The $N_2$ gas forms a stream of gas that catches and transfers the residual matter 41 decomposed by being heated, thereby ensuring that the deposit film 76 and the BPSG film 75 are removed.

Furthermore, with the above described substrate processing method, the HF gas is supplied toward the wafer W having the BPSG film 75 and the deposit film 76 formed thereon. The HF gas is combined with water molecules contained in the BPSG film 75 and the deposit film 76 to form fluorinated acid that erodes and selectively etches the films 75, 76. Therefore, at the time of removal of the films 75, 76, the thermally-oxidized film 72 is prevented from being removed, whereby formation of a notch can be prevented.

Figure 4:
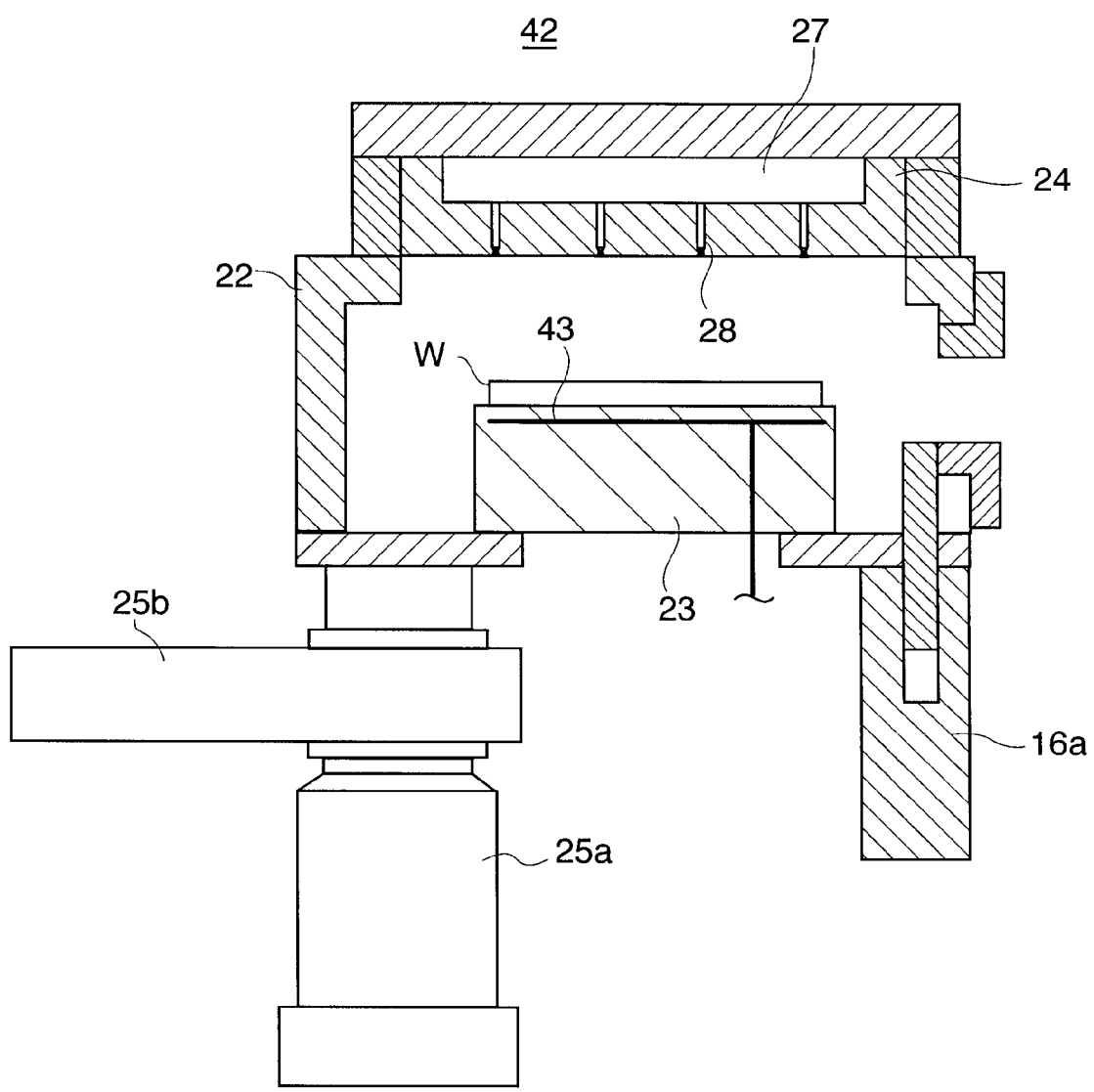
FIG. 4 is a section view showing a modification of a gas process module shown in FIG. 1.

In the above described substrate processing system 10, the gas process module 16 and the heating process module 17 are provided as independent apparatuses. Alternatively, as shown in FIG. 4, there may be provided a stage heater 43 having a stage 23 in which a gas process module 42 is incorporated, wherein the stage heater 43 can heat a wafer W placed on the stage 23. In that case, with use of only the gas process module 42, the BPSG film 75 and the deposit film 76 can selectively be etched and the residual matter 41 can thermally be decomposed. Thus, both the functions of the gas process module and the thermal process module can be realized by means of one process module, making it possible to downsize the substrate processing system 10.

Next, a substrate processing system according to a second embodiment of this invention will be described.

This embodiment is basically the same in construction and function as the first embodiment, and only differs therefrom in that this embodiment does not utilize thermal decomposition of residual matter. In the following, constructions and functions of this embodiment that are different from those of the first embodiment will be explained, with explanations on the same or similar construction omitted.

As described in the above, when the BPSG film 75 and the deposit film 76 are removed using fluorinated acid, chemical reaction takes place between the fluorinated acid and the BPSG film 75 or the deposit film 76, to produce a residual matter 41 ($H_2SiF_6$). In this embodiment, $NH_3$ is used to remove the residual matter 41. More specifically, $NH_3$ gas is supplied toward the residual matter to cause chemical reaction represented by the following formula.

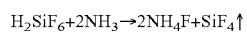

$$H_2SiF_6 + 2NH_3 \rightarrow 2NH_4F + SiF_4\uparrow$$

In this way, there are generated $NH_4F$ (ammonium fluoride) and $SiF_4$. The $NH_4F$ is a product of chemical reaction, which can be sublimated. By setting an ambient temperature somewhat higher than a room temperature, the $NH_4F$ can be sublimated and therefore can easily be removed.

In this embodiment, therefore, the $H_2SiF_6$, which is a residual matter produced by chemical reaction between $SiO_2$ and fluorinated acid, is removed by causing chemical reaction between $H_2SiF_6$ and $NH_3$ and sublimation of $NH_4F$.

The substrate processing system of this embodiment is the same in construction as the substrate processing system 10 shown in FIG. 1. Instead of the gas process module 16 and the heating process module 17, there is provided the gas process module 44 (HF gas supply apparatus and cleaning gas supply apparatus) for selectively etching the BPSG film 75 and the deposit film 76, for causing chemical reaction between the residual matter 41 and $NH_3$, and for causing sublimation of a product of the chemical reaction ($NH_4F$). The gas process module 44 is connected via a vacuum gate valve 44a to the transfer module 11.

Figure 5:
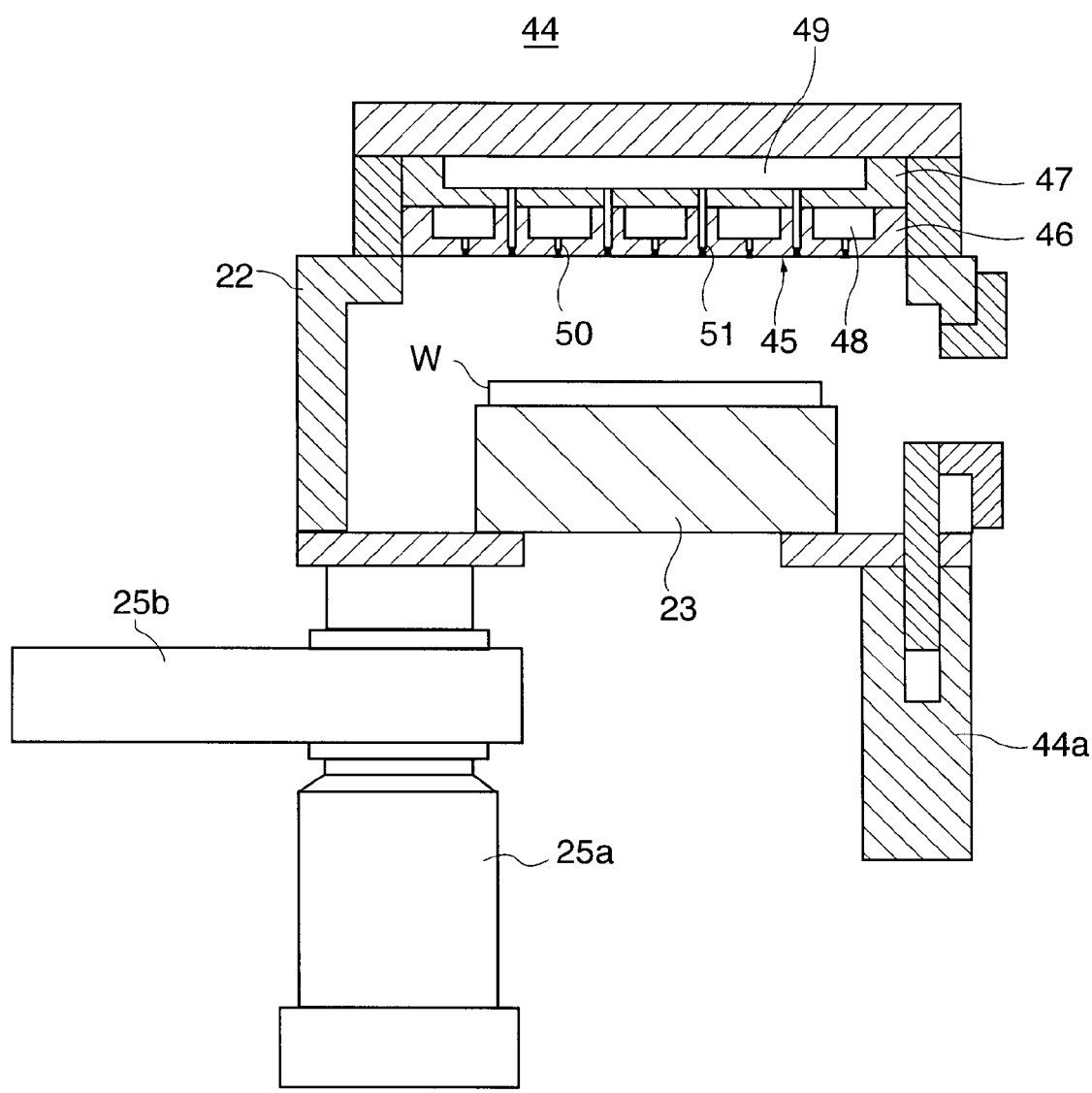
FIG. 5 is a section view showing a gas process module of a substrate processing system according to a second embodiment of the present invention.

FIG. 5 is a section view showing the gas process module 44 of the substrate processing system of this embodiment.

In FIG. 5, the gas process module 44 includes a chamber 22, a stage 23, a shower head 45, a TMP 25a, and an APC valve 25b.

The shower head 45 is comprised of a disk-shaped lower gas supply section 46 and an upper gas supply section 47 which is stacked on the lower gas supply section 46. The lower and upper gas supply sections 46, 47 have first and second buffer chambers 48, 49, respectively. The first and second buffer chambers 48, 49 are respectively communicated via gas-passing holes 50, 51 to the inside of the chamber 22.

The first buffer chamber 48 is communicated with an $NH_3$ (ammonia) gas supply system (not shown), which can supply the first buffer 48 with an $NH_3$-containing gas (cleaning gas). The supplied cleaning gas is supplied via gas-passing holes 50 to the inside of the chamber 22. The second buffer chamber 49 is connected to an HF gas supply system, which can supply the second buffer chamber 49 with an HF gas. The supplied HF gas is then supplied via gas-passing holes 51 to the inside of the chamber 22.

Like the gas-passing holes 28 shown in FIG. 2B, each of the gas-passing holes 50, 51 is formed to have a portion thereof opening out into the chamber 22 and formed to widen out toward an end thereof, whereby the cleaning gas and the HF gas can efficiently be diffused into the chamber 22. Furthermore, each of the gas-passing holes 50, 51 has a cross-sectional shape having a constriction therein, whereby the residual matter or the like generated in the chamber 22 can be prevented from flowing back into the gas-passing holes 50, 51 and then into the first and second buffer chambers 48, 49.

In the gas process module 44, a heater (not shown), for example a heating element, is built into a side wall of the chamber 22. As a result, it is possible to set the ambient temperature in the chamber 22 to be higher than a room temperature, thereby promoting sublimation of $NH_4F$ described later.

Next, an explanation will be given of a substrate processing method according to this embodiment.

FIGS. 6A to 6E are a process diagram showing the substrate processing method implemented by the substrate processing system of this embodiment.

Like the case shown in FIG. 3A, a wafer W is first transferred into either one of the plasma process modules 12 to 15. In the plasma process module into which the wafer W has been transferred, a hole or a trench is formed in the single-crystal silicon substrate base 71 of the wafer W using a plasma generated from the HBr gas (plasma etching step). At that time, a deposit film 76 is formed in the hole or trench in the wafer W (FIG. 6A).

Figure 6A:
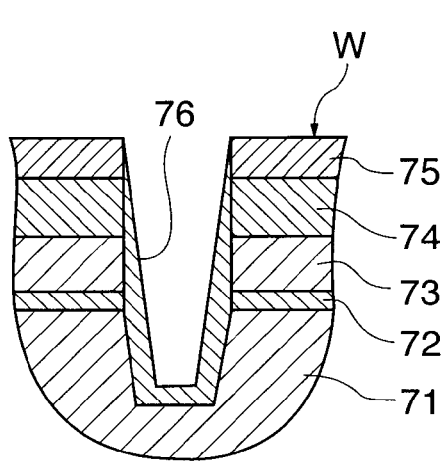
Figure 6B:
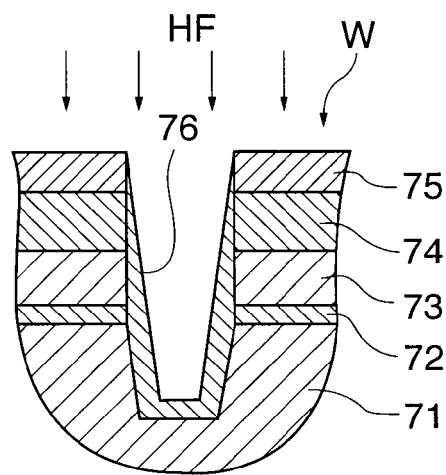

Next, the wafer W shown in FIG. 6A is transferred out from the plasma process module, and is then transferred via the transfer module 11 into the chamber 22 of the gas process module 44. The wafer W is placed on the stage 23. The pressure within the chamber 22, the ambient temperature within the chamber 22, the flow rate at which the HF gas is supplied from the upper gas supply section 47 are set in a manner similar to in the case shown in FIG. 3B (HF gas supply step). As with the case shown in FIG. 3B, water molecules are nearly completely removed from within the chamber 22, and no $H_2O$ gas is supplied to the chamber 22.

Figure 6C:
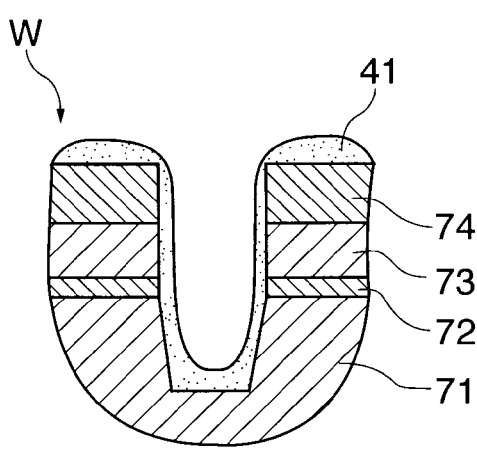

As with the case shown in FIG. 3C, a residual matter 41 is produced by chemical reaction between fluorinated acid and $SiO_2$ contained in the BPSG film 75 and the deposit film 76, and is deposited on the films 73, 74, the thermally-oxidized film 72, and the single-crystal silicon substrate base 71 in the hole or the trench (FIG. 6C).

Figure 6D:
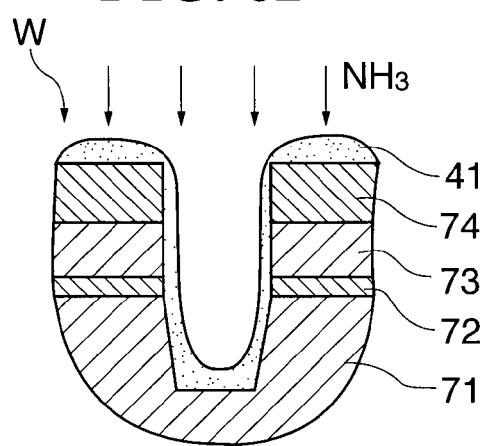
Figure 6E:
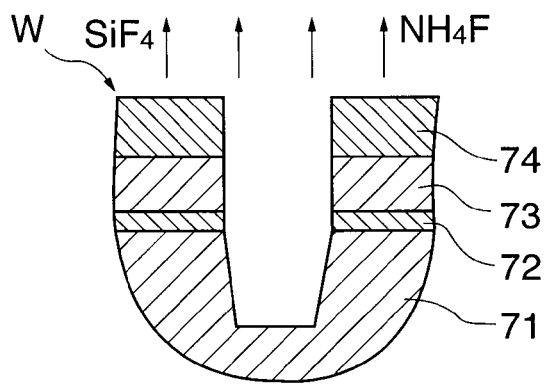

Next, the HF gas supply to the chamber 22 is terminated. Thereafter, a cleaning gas is supplied from the lower gas supply section 46 of the shower head 45 toward the wafer W (cleaning gas supply step) (FIG. 6D). At that time, $NH_3$ gas contained in the cleaning gas reacts with $H_2SiF_6$ constituting the residual matter 41 to produce $NH_4F$ and $SiF_4$. Then, the ambient temperature within the chamber 22 is set to be somewhat higher than the room temperature using the heating element in the side wall of the chamber, whereby the $NH_4F$ is sublimated (FIG. 6E).

Next, the wafer W is transferred out from the chamber 22 of the gas process module 44, and the present process is terminated.

According to the substrate processing method of this embodiment, part of the single-crystal silicon substrate base 71 of the wafer W is exposed through the thermally-oxidized film 72, the films 73, 74, and the BPSG film 75 and is etched by the plasma of HBr gas, the HF gas is supplied toward the wafer W, and the cleaning gas containing $NH_3$ gas is supplied toward the wafer W. When the single-crystal silicon substrate base 71 is etched by the plasma of HBr gas, a deposit film 76 is formed. Fluorinated acid generated from the HF gas selectively etches the deposit film 76 and the BPSG film 75, and produces a residual matter 41. The $NH_3$ gas reacts with the residual matter 41 to produce a product of chemical reaction ($NH_4F$) which is easily sublimated. The reaction product is easily sublimated when the ambient temperature in the chamber 22 is set to be somewhat higher than the room temperature. In other words, the deposit film 76 and the BPSG film 75 can be removed in a dry environment. This makes it possible to install the gas process module 44 in the substrate processing system 10. Accordingly, after the single-crystal silicon substrate base 71 of the wafer is etched, the wafer W can be transferred via the transfer module 11 into the gas process module 44. Thus, after the single-crystal silicon substrate base 71 has been etched, the deposit film 76 and the BPSG film 75 can be removed without the wafer W being exposed to the atmospheric air. This makes it possible to simplify the substrate processing process and eliminate the need of managing a time period of exposure of the wafer W, whereby a reduction in productivity of the fabrication of a semiconductor device from the wafer W can be prevented.

Since the above described substrate processing method permits the gas process module 44 to be installed on the substrate processing system, it is unnecessary to install the gas process module 44 at a location different from the system, thus making it possible to reduce a footprint of the entire system.

Since the above described substrate processing method can realize the selective etching of the BPSG film 75 and the deposit film 76 and the removal of the residual matter 41 only by use of the gas process module 44, the substrate processing system 10 can be downsized.

It should be noted that the selective etching of the BPSG film 75 and the deposit film 76, the generation of the reaction product from the residual matter 41, and the sublimation of the reaction product may be realized using different process modules.

In the above described embodiments, the BPSG film 75 is used as a hard mask. However, the oxide film used as the hard mask is not limited thereto, but may be one that contains a higher impurity content at least than in the thermally-oxidized film 72. Specifically, there may be provided a TEOS (tetra ethyl ortho silicate) film or a BSG (boron silicate glass) film. The residual matter to be removed is not limited to $H_2SiF_6$. The present invention is applicable to the removal of any residual matter that is generated at the time of removal of oxide films using fluorinated acid.

It is to be understood that the present invention can also be attained by supplying a computer with a storage medium in which a program code of software that realizes the functions of the embodiments described above is stored, and then causing the computer to read out and execute the program code stored in the storage medium.

In this case, the program code itself read out from the storage medium realizes the functions of the embodiments described above, and hence the program code and the storage medium in which the program code is stored constitute the present invention.

The storage medium for supplying the program code may be, for example, a floppy (registered trademark) disk, a hard disk, a magnetic-optical disk, an optical disk such as a CD-ROM, a CD-R, a CD-RW, a DVD-ROM, a DVD-RAM, a DVD-RW, or a DVD+RW, a magnetic tape, a non-volatile memory card, or a ROM. Alternatively, the program may be downloaded via a network from another computer, a database, or the like, not shown, connected to the Internet, a commercial network, a local area network, or the like.

Moreover, it is to be understood that the functions of the embodiments can be accomplished not only by executing a program code read out by the computer, but also by causing an OS (operating system) or the like which operates on the computer to perform a part or all of the actual operations based on instructions of the program code.

Furthermore, it is to be understood that the functions of the embodiments can also be accomplished by writing a program code read out from a storage medium into a memory provided on an expansion board inserted into the computer or in an expansion unit connected to the computer and then causing a CPU or the like provided on the expansion board or in the expansion unit to perform a part or all of the actual operations based on instructions of the program code.

The form of the program code may be an object code, a program code executed by an interpreter, script data supplied to an OS, or the like.

What is claimed is:

1. A substrate processing method for processing a substrate having a single-crystal silicon substrate base, a first oxide film formed by a thermal oxidation treatment and containing no $H_2O$ molecules, and a second oxide film containing an impurity, a part of the single-crystal silicon substrate base being exposed through the first and second oxide films in a chamber, comprising:

a plasma etching step of etching the exposed single-crystal silicon substrate base using a plasma of a halogen-based gas;

a $H_2O$ molecules removing step of removing $H_2O$ molecules from the chamber without supplying additional $H_2O$ molecules when an HF gas is supplied to the chamber;

an HF gas supply step of supplying the HF gas toward the substrate without supplying additional $H_2O$ molecules so as to combine the HF gas and $H_2O$ molecules contained in the second oxide film and a deposit film which has been formed on the substrate in said plasma etching step to change the second oxide film and the deposit film into a residual matter; and a cleaning gas supply step of supplying a cleaning gas containing at least $NH_3$ gas toward the substrate on which both the first oxide film and the residual matter exist contemporaneously, wherein the first oxide film containing no $H_2O$ molecules does not combine with the HF gas so that the first oxide film is not changed into a residual matter in said HF gas supply step.

2. The substrate processing method according to claim 1, wherein the substrate is not exposed to ambient air during said plasma etching step, said HF gas supply step, and said cleaning gas supply step.

* * * * *